(12) United States Patent
Aoki

(10) Patent No.: US 8,748,210 B2
(45) Date of Patent: Jun. 10, 2014

(54) METHOD OF MANUFACTURING SEMICONDUCTOR DEVICE HAVING AIR GAPS IN MULTILAYER WIRING STRUCTURE

(71) Applicant: Canon Kabushiki Kaisha, Tokyo (JP)

(72) Inventor: Takeshi Aoki, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/707,887

(22) Filed: Dec. 7, 2012

(65) Prior Publication Data

US 2013/0122644 A1 May 16, 2013

Related U.S. Application Data

(62) Division of application No. 12/782,889, filed on May 19, 2010, now Pat. No. 8,350,300.

(30) Foreign Application Priority Data

Jun. 8, 2009 (JP) ................................. 2009-137721

(51) Int. Cl.
*H01L 21/00* (2006.01)
*H01L 27/148* (2006.01)
*H01L 31/00* (2006.01)

(52) U.S. Cl.
USPC .................. 438/57; 438/66; 438/71; 438/83; 438/98; 257/222; 257/231; 257/459; 257/E31.095; 257/E31.113

(58) Field of Classification Search
None
See application file for complete search history.

(56) References Cited

U.S. PATENT DOCUMENTS

| | | | |
|---|---|---|---|
| 4,561,173 A | 12/1985 | Te Velde | 438/619 |
| 6,211,561 B1 | 4/2001 | Zhao | 257/522 |
| 6,710,449 B2 | 3/2004 | Hyoto et al. | 257/758 |
| 6,713,835 B1 * | 3/2004 | Horak et al. | 257/522 |
| 6,984,577 B1 | 1/2006 | Zhao et al. | 438/619 |
| 7,214,920 B2 | 5/2007 | Gazeley | 250/208.1 |
| 7,720,119 B2 | 5/2010 | Aoki | 372/38.02 |
| 2003/0049945 A1 | 3/2003 | Hyoto et al. | 438/708 |
| 2008/0157269 A1 | 7/2008 | Wong et al. | 257/529 |
| 2008/0219048 A1 | 9/2008 | Lee et al. | 365/164 |
| 2009/0020842 A1 | 1/2009 | Shiau et al. | 257/459 |

FOREIGN PATENT DOCUMENTS

| | | |
|---|---|---|
| JP | 5-036841 | 2/1993 |
| JP | 2001-015592 | 1/2001 |
| WO | WO 2004/105122 | 12/2004 |

OTHER PUBLICATIONS

Extended European Search Report, issued Aug. 10, 2012 in EPO counterpart application 10169849 (in English).

* cited by examiner

*Primary Examiner* — Michael Jung
(74) *Attorney, Agent, or Firm* — Fitzpatrick, Cella, Harper & Scinto

(57) ABSTRACT

A semiconductor device comprises a semiconductor substrate, and a multilayer wiring structure arranged on the semiconductor substrate, the multilayer wiring structure including a plurality of first electrically conductive lines, an insulating film covering the plurality of first electrically conductive lines, and a second electrically conductive line arranged on the insulating film so as to intersect the plurality of first electrically conductive lines, wherein the insulating film has gaps in at least some of a plurality of regions where the plurality of first electrically conductive lines and the second electrically conductive line intersect each other, and a width of the gap in a direction along the second electrically conductive line is not larger than a width of the first electrically conductive line.

4 Claims, 19 Drawing Sheets

METHOD OF MANUFACTURING SEMICONDUCTOR DEVICE HAVING AIR GAPS IN MULTILAYER WIRING STRUCTURE

RELATED APPLICATIONS

The present application is a divisional of application Ser. No. 12/782,889, filed May 19, 2010. The present application claims benefit of application Ser. No. 12/782,889 under 35 U.S.C. §120, and claims priority benefit under 35 U.S.C. §119 from Japanese Patent Application No. 2009-137721, filed Jun. 8, 2009. The entire contents of each of the mentioned prior applications are incorporated herein by reference.

BACKGROUND OF THE INVENTION

1. Field of the Invention

The present invention relates to a semiconductor device and a method of manufacturing the same.

2. Description of the Related Art

Miniaturization of semiconductor devices is making significant progress. The miniaturization is promoting multilayer wiring structures. The multilayer wiring structure suffers the capacitance (to be referred to as a line-to-line capacitance) parasitic between upper and lower lines via an interlayer dielectric film. Image sensors, particularly CMOS image sensors, need to shorten the distance from the light receiving surface of a photoelectric conversion element in each pixel to a micro-lens above the photoelectric conversion element to prevent degradation of optical characteristics when the pixel pitch is decreased. Along with this, an interlayer dielectric film interposed between the photoelectric conversion element and the micro-lens becomes thinner, increasing the line-to-line capacitance.

To solve this, Japanese Patent Laid-Open No. 5-36841 describes formation of a space 6 around a first-layer wiring structure 4. More specifically, after forming the first-layer wiring structure 4, a SiN film 1 is formed to cover the first-layer wiring structure 4. Further, a $SiO_2$ film 2 is formed to cover the SiN film 1. A small hole 7 is formed in the $SiO_2$ film 2 at a portion above the first-layer wiring structure 4. A space 6 is formed around the first-layer wiring structure 4 by dry etching through the small whole 7 using a $CF_4/O_2$ gas mixture. A spin-on-glass film 3 is then formed and sintered to cover the $SiO_2$ film 2. At this time, the spin-on-glass film 3 does not enter the space 6 through the small hole 7 because of high surface tension. Thus, the small hole 7 can be closed while maintaining the space 6 around the first-layer wiring structure 4. According to Japanese Patent Laid-Open No. 5-36841, the line-to-line capacitance can be greatly reduced by forming the space 6 around the first-layer wiring structure 4.

In the arrangement disclosed in Japanese Patent Laid-Open No. 5-36841, as a second-layer wiring structure 5 becomes longer, the space 6 also becomes longer, decreasing the mechanical strength of the wiring structure. This wiring structure may be deformed or broken by CMP (Chemical Mechanical Polishing) in a subsequent step.

SUMMARY OF THE INVENTION

The present invention provides a technique of suppressing a decrease in mechanical strength of a multilayer wiring structure while reducing the line-to-line capacitance in the multilayer wiring structure.

The first aspect of the present invention provides a semiconductor device comprises a semiconductor substrate, and a multilayer wiring structure arranged on the semiconductor substrate, the multilayer wiring structure including a plurality of first electrically conductive lines, an insulating film covering the plurality of first electrically conductive lines, and a second electrically conductive line arranged on the insulating film so as to intersect the plurality of first electrically conductive lines, wherein the insulating film has gaps in at least some of a plurality of regions where the plurality of first electrically conductive lines and the second electrically conductive line intersect each other, and a width of the gap in a direction along the second electrically conductive line is not larger than a width of the first electrically conductive line.

The second aspect of the present invention provides a method of manufacturing a semiconductor device having a semiconductor substrate, the method comprising a first step of forming a plurality of first electrically conductive lines above the semiconductor substrate, a second step of forming an insulating film to cover the plurality of first electrically conductive lines, a third step of forming a plurality of trenches in the insulating film at a width not larger than a width of the first electrically conductive line, the plurality of trenches causing part of upper surfaces of the plurality of first electrically conductive lines to expose, a fourth step of filling the plurality of trenches with first insulators, a fifth step of forming second electrically conductive lines on the insulating film and the first insulators so as to intersect the plurality of first electrically conductive lines, a sixth step of removing the first insulators from the respective trenches after the fifth step, and a seventh step of filling, with second insulators, portions of the plurality of trenches that do not overlap the second electrically conductive lines when viewed in a direction perpendicular to a surface of the semiconductor substrate, so as to leave, as gaps, at least some of a plurality of regions where the plurality of first electrically conductive lines and the second electrically conductive lines intersect each other in the plurality of trenches, wherein a width of the gap in a direction along the second electrically conductive line is not larger than a width of the first electrically conductive line.

Further features of the present invention will become apparent from the following description of exemplary embodiments with reference to the attached drawings.

DESCRIPTION OF THE EMBODIMENTS

Figure 1A:
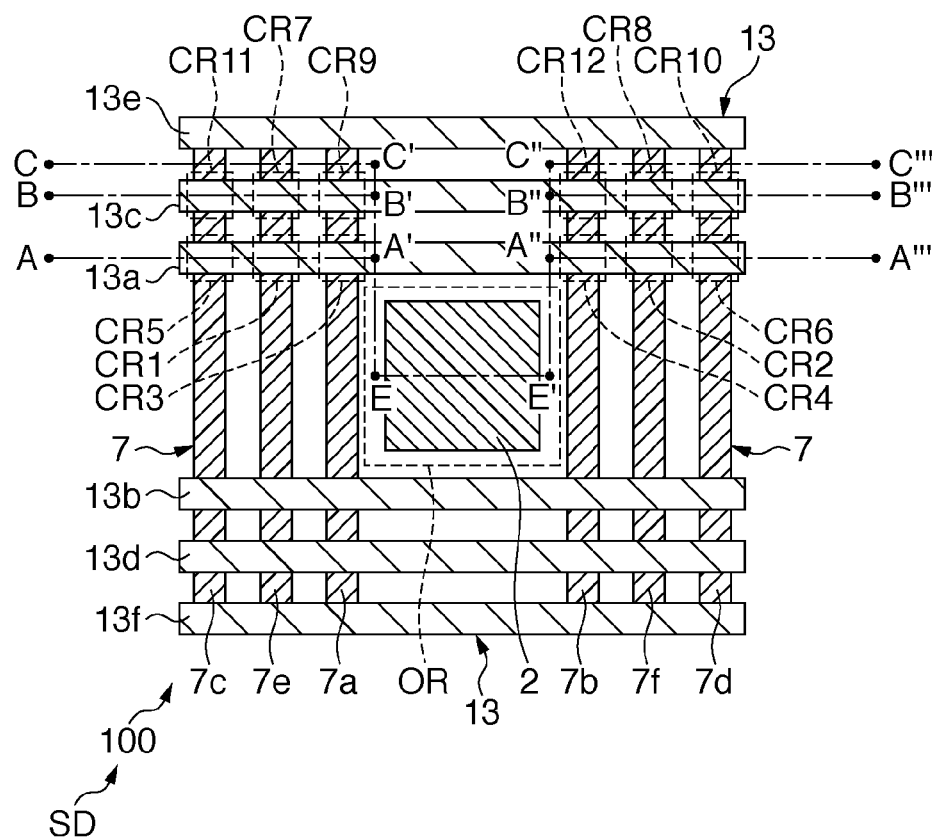
FIGS. 1A, and 1B and 1C are a plan view, and a sectional view and a detail of the plan view, respectively, showing the structure of a semiconductor device SD according to the first embodiment.
Figure 1B:
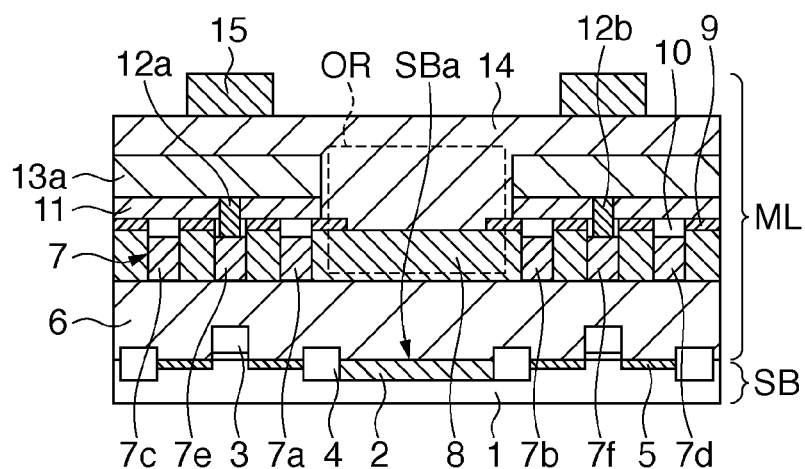
Figure 1C:
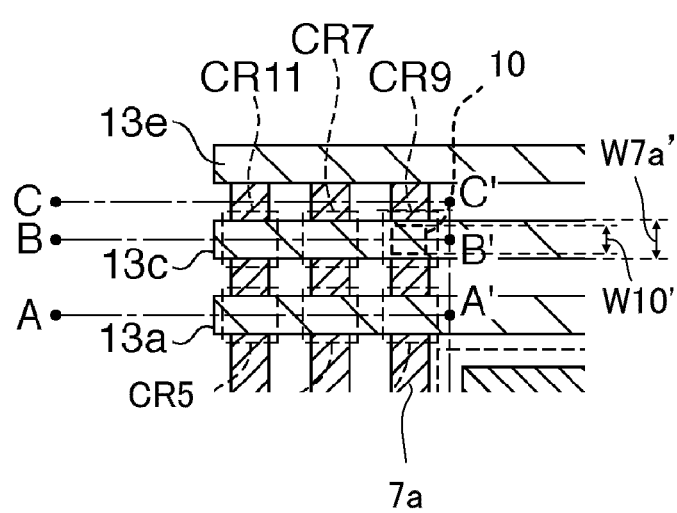
Figure 2A:
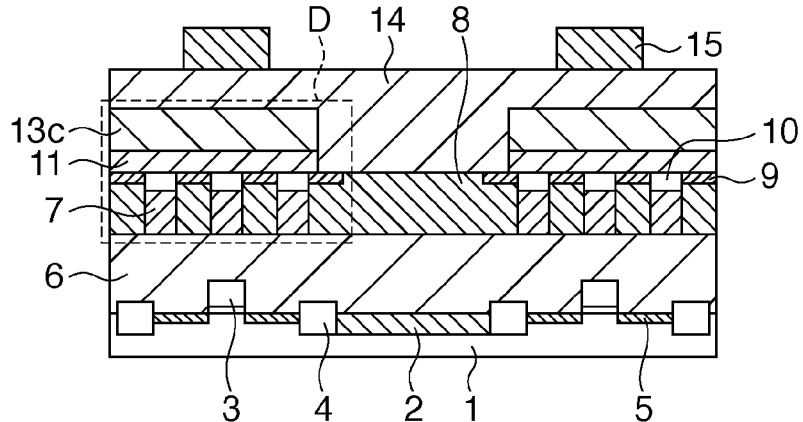
FIGS. 2A to 2C are sectional views showing the structure of the semiconductor device SD according to the first embodiment.
Figure 2B:
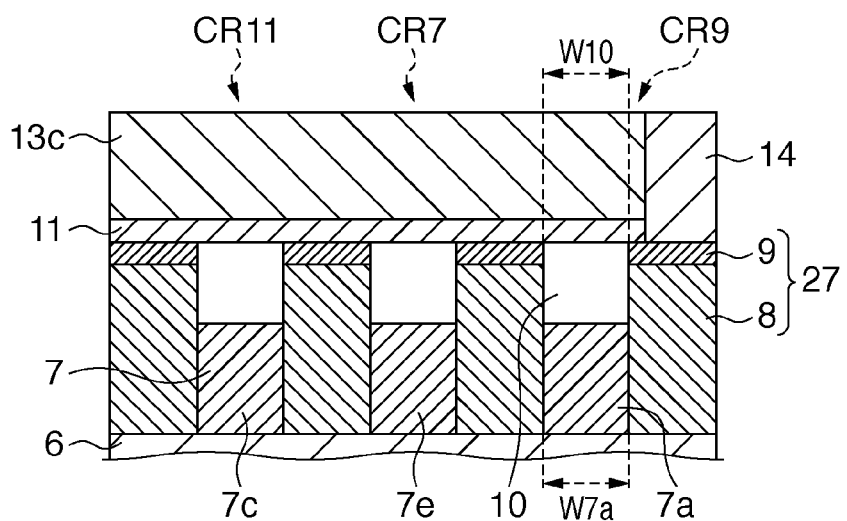
Figure 2C:
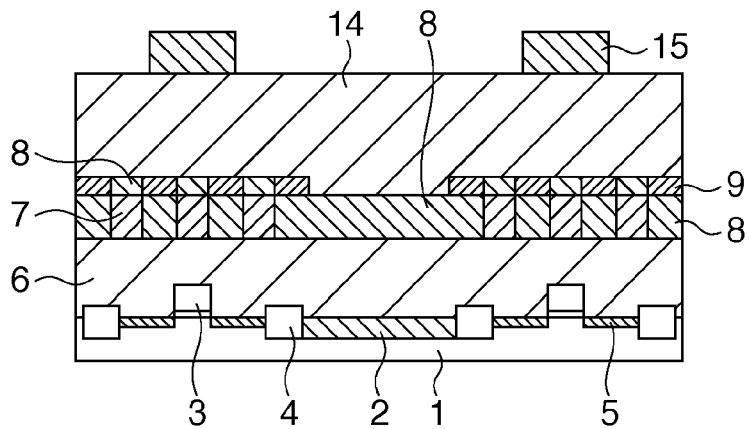

The structure of a semiconductor device SD according to the first embodiment of the present invention will be described with reference to FIGS. 1A, 1B, 1C, 2A, and 2B. The semiconductor device SD includes a photoelectric conversion device 100. FIG. 1A is a schematic view of a wiring structure in the photoelectric conversion device 100 of the semiconductor device SD when viewed from the top, a portion of which is shown also in FIG. 1C. FIG. 1B is a sectional view showing sections A-A', E-E', and A"-A'" in FIG. 1A. In FIG. 1B, the sections A-A', E-E', and A"-A'" are superposed for illustrative convenience. FIG. 2A is a sectional view showing sections B-B', E-E', and B"-B'" in FIG. 1A. In FIG. 2A, the sections B-B', E-E', and B"-B'" are superposed for illustrative convenience. FIG. 2C is a sectional view showing sections C-C", E-E', and C"-C'" in FIG. 1A. In FIG. 2C, the sections C-C', E-E', and C"-C'" are superposed for illustrative convenience.

The photoelectric conversion device 100 of the semiconductor device SD includes a semiconductor substrate SB and multilayer wiring structure ML. In a well region 1 of the semiconductor substrate SB, a plurality of photoelectric converters 2 are arranged two-dimensionally. Each photoelectric converter 2 generates charges corresponding to light. The photoelectric converter 2 is, for example, a photodiode. Diffusion layers 5 each serving as the source or drain electrode of a MOS transistor are arranged in the well region 1 of the semiconductor substrate SB. Element isolating portions 4 are arranged in the semiconductor substrate SB. The element isolating portions 4 define an active region in the semiconductor substrate SB, electrically separate a plurality of photoelectric converters 2, and electrically separate a plurality of MOS transistors.

The multilayer wiring structure ML is arranged on the semiconductor substrate SB and includes the following building elements. A gate electrode 3 in each MOS transistor is arranged on the surface of the semiconductor substrate SB to be interposed between two diffusion layers (source and drain electrodes) 5. The gate electrode 3 is made of, for example, polysilicon and can also be formed as a line (polysilicon line). An insulating film 6 covers the semiconductor substrate SB and gate electrodes 3 and has a flat upper surface. A first wiring structure 7 is arranged on the insulating film 6. The first wiring structure 7 is made of, for example, a metal or intermetallic compound mainly containing aluminum. The first wiring structure 7 includes a plurality of first electrically conductive lines 7a to 7f. Among the first electrically conductive lines 7a to 7f, the first electrically conductive lines 7a and 7b define an opening region OR above the photoelectric converter 2. An insulating film 8 covers the first electrically conductive lines 7a to 7f of the first wiring structure 7. An insulating film 9 covers the insulating film 8. The insulating film 9 is resistant to polishing of the insulating film 8, and thus functions as a polishing stopper layer when polishing and planarizing an interlayer dielectric film on the first electrically conductive lines. The insulating film 9 has openings at positions above the first electrically conductive lines 7a to 7f, and an opening at a position above the photoelectric converter 2. The insulating film 9 is higher in refractive index than the insulating film 8 and an insulating film 11, and reduces reflection of light at the interfaces with them. The insulating film 11 covers the insulating film 9. A second wiring structure 13 is arranged on the insulating films 8, 9, and 11. The second wiring structure 13 is made of, for example, a metal or intermetallic compound mainly containing aluminum. The second wiring structure 13 includes a plurality of second electrically conductive lines 13a to 13f. Among the second electrically conductive lines 13a to 13f, the second electrically conductive lines 13a and 13b define the opening region OR above the photoelectric converter 2. The second electrically conductive lines 13a to 13f extend to intersect the first electrically conductive lines 7a to 7f when viewed in a direction perpendicular to a surface SBa of the semiconductor substrate SB. An insulating film 14 covers the insulating films 8, 9, and 11, and second wiring structure 13, and has a flat upper surface. A third wiring structure 15 is arranged on the insulating film 14.

As shown in FIGS. 1A, 1B, and 2A, plugs 12a and 12b are arranged in line-intersecting regions CR1 and CR2 among line-intersecting regions CR1 to CR12. The plug 12a electrically connects the first electrically conductive line 7e and second electrically conductive line 13a. The plug 12b electrically connects the first electrically conductive line 7f and second electrically conductive line 13a. The plugs 12a and 12b are made of, for example, a metal or intermetallic compound mainly containing tungsten. Air gaps 10 are defined in the remaining line-intersecting regions CR3 to CR12 among the line-intersecting regions CR1 to CR12. More specifically, the insulating films 8 and 9 have the air gaps 10 in the respective line-intersecting regions CR3 and CR12. No air gap 10 is defined in a region where the first and second electrically conductive lines do not intersect each other. The air gap 10 is a vacuum space or is filled with air. The permittivity of the air gap 10 is about 1, which is much lower than that of an insulating film (e.g., $SiO_2$ or SiN). That is, the air gap 10 is formed at a portion where the line-to-line capacitance serving as a parasitic capacitance between the first and second electrically conductive lines is large. No air gap 10 is formed at a portion where the line-to-line capacitance is small. This can effectively, efficiently reduce the line-to-line capacitance. A structure concerning the air gap 10 will be explained in detail with reference to FIG. 2B. FIG. 2B is an enlarged view of a region D in the section of FIG. 2A. The air gap 10 in the region CR9 where the first electrically conductive line 7a and second electrically conductive line 13c intersect each other has a width W10 in a direction along the second electrically conductive line 13c, which is equal to or smaller than a width W7a of the first electrically conductive line 7a. Although not shown, the The air gap 10 has a width W10' in a direction along the first electrically conductive line 7a, which is equal to or smaller than the width W7a' of the second electrically conductive line 13c (see FIG. 1C). On the four sides of the air gap 10, columns 27 support the gap between the insulating films 6 and 11. The column 27 includes the insulating films 8 and 9. This suppresses a decrease in mechanical strength around the air gap 10, i.e., mechanical strength of the multilayer wiring structure ML. In this way, the embodiment can suppress a decrease in mechanical strength of the multilayer wiring structure ML in the semiconductor device SD while reducing the line-to-line capacitance in the multilayer wiring structure ML. Since the photoelectric conversion device 100 has been mainly described, the insulating film 9 has an opening above the photoelectric converter 2. However, this structure can be omitted when the present invention is applied to a semiconductor device other than the photoelectric conversion device.

A method of manufacturing the semiconductor device SD according to the first embodiment of the present invention will be explained with reference to FIGS. 3A to 11C. Sections shown in FIGS. 3A, 3B, 4, and 6A to 6C correspond to that in FIG. 1B. FIG. 5 is a plan view in the step of FIG. 4. Sections shown in FIGS. 7A to 7C correspond to those in FIGS. 1B, 2A, and 2C. FIG. 8 is a plan view in the steps of FIGS. 7A to 7C. Sections shown in FIGS. 9A to 9C correspond to those in FIGS. 1B, 2A, and 2C. FIG. 10 is a plan view in the steps of FIGS. 9A to 9C. Sections shown in FIGS. 11A to 11C correspond to those in FIGS. 1B, 2A, and 2C.

Figure 3A:
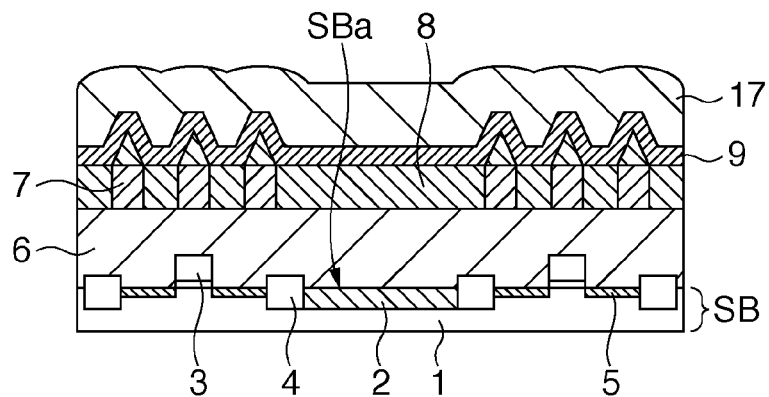
FIGS. 3A to 3C are sectional views showing a method of manufacturing the semiconductor device SD according to the first embodiment.

In the step of FIG. 3A, element isolating portions 4 are formed in the semiconductor substrate SB. Gate electrodes 3 are formed in active regions defined by the element isolating portions 4 on the surface SBa of the semiconductor substrate SB. Ions are implanted into the semiconductor substrate SB using the gate electrodes 3 as a mask, forming a photoelectric converter 2 and diffusion layers 5 in a well region 1 (active region) of the semiconductor substrate SB. The gate electrode 3 and diffusion layers 5 form a MOS transistor. Then, an insulating film 6 is formed to cover the semiconductor substrate SB and gate electrodes 3. The insulating film 6 is polished using CMP, planarizing the upper surface of the insulating film 6. Through holes (not shown) are formed in the insulating film 6 to expose, for example, the surfaces of the diffusion layers 5. The through holes are filled with a metal (e.g., tungsten), forming plugs (not shown). Respective films of a metal layered film (e.g., a layered film of TiN film/AlCu alloy film/TiN film) are sequentially deposited on the insulating film 6 by sputtering. The metal layered film is formed into the pattern of a first wiring structure 7 by photolithography and dry etching. More specifically, a plurality of first electrically conductive lines 7a to 7f are formed above the semiconductor substrate SB (first step). An insulating film 8 is formed using high-density plasma CVD to cover the first wiring structure 7 (first electrically conductive lines 7a to 7f (second step). The insulating film 8 is made of, for example, $SiO_2$. An insulating film 9 is formed using plasma CVD to cover the insulating film 8. The insulating film 9 is made of, for example, SiN. An insulating film 17 is formed using plasma CVD to cover the insulating film 9. The insulating film 17 functions as a sacrificial film in polishing. The insulating film 17 is made of, for example, $SiO_2$.

Figure 3B:
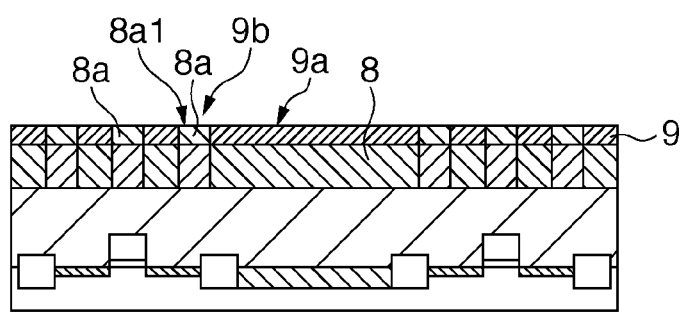

In the step of FIG. 3B, the insulating films 17, 9, and 8 are polished using CMP until an upper surface 9a of the insulating film 9 is exposed. As a result, portions 8a of the insulating film 8 that are positioned on the first electrically conductive lines are exposed at a width equal to or smaller than that of the first electrically conductive line. In other words, (slit-like) openings 9b of the insulating film 9 that are positioned above the first electrically conductive lines are formed at a width equal to or smaller than that of the first electrically conductive line. At the same time, a flat upper surface including surfaces 8a1 of the portions 8a of the insulating film 8 and the upper surface 9a of the insulating film 9 is obtained. The polishing rate of the insulating film 9 (e.g., SiN film) is equal to or lower than ⅓ of that of the insulating film 17 (e.g., $SiO_2$ film). That is, the insulating film 9 is resistant to polishing of the insulating film 17 and thus functions as a polishing stopper layer. The insulating film 17 can be selectively polished without excessively polishing the insulating film 8 and polishing the first electrically conductive lines. Then, the planarization process ends. The thickness of the insulating film 9 is equal to or larger than the lower limit value of a film thickness enough to function as a polishing stopper layer, and equal to or smaller than the upper limit value of a film thickness which makes it possible to position the portion 8a at the same level as the upper surface 9a. Note that the insulating films 8 and 9 project on the first electrically conductive lines before polishing, as shown in FIG. 3A. However, the projections are removed through polishing and do not remain after planarization.

Figure 3C:
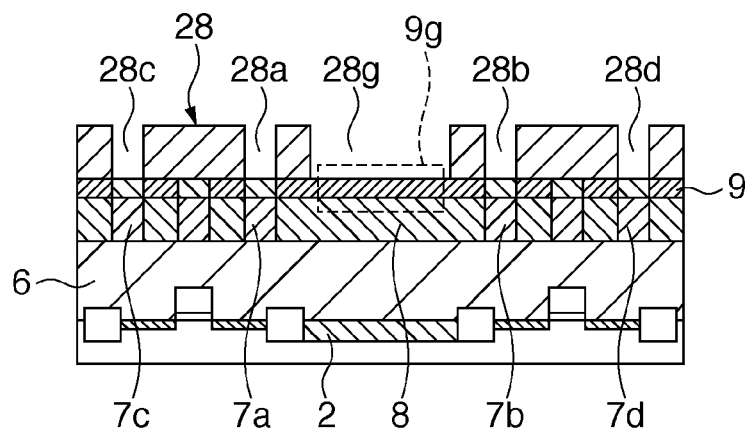

In the step of FIG. 3C, an etching mask 28 is formed on the insulating film 9 by photolithography. The etching mask 28 has an opening 28g in a region above the photoelectric converter 2, and has openings 28a to 28d in regions where trenches 19 (see FIG. 5) are to be formed. The etching mask 28 covers regions (see the portions 8a in FIG. 5) where no trench 19 is to be formed. The etching mask 28 is made of, for example, a photoresist resin.

Figure 4:
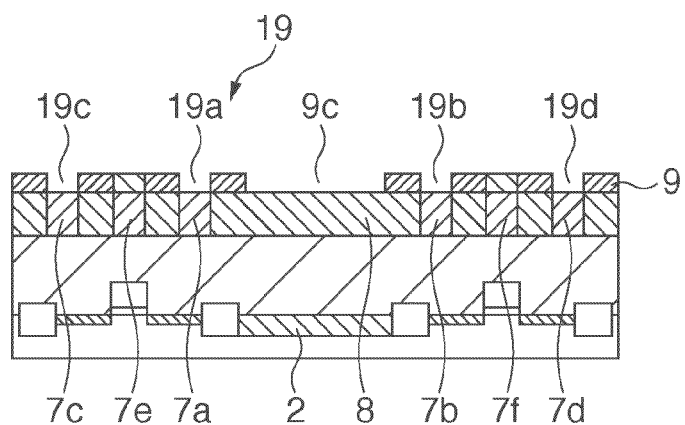
FIG. 4 is a sectional view showing the method of manufacturing the semiconductor device SD according to the first embodiment.
Figure 5:
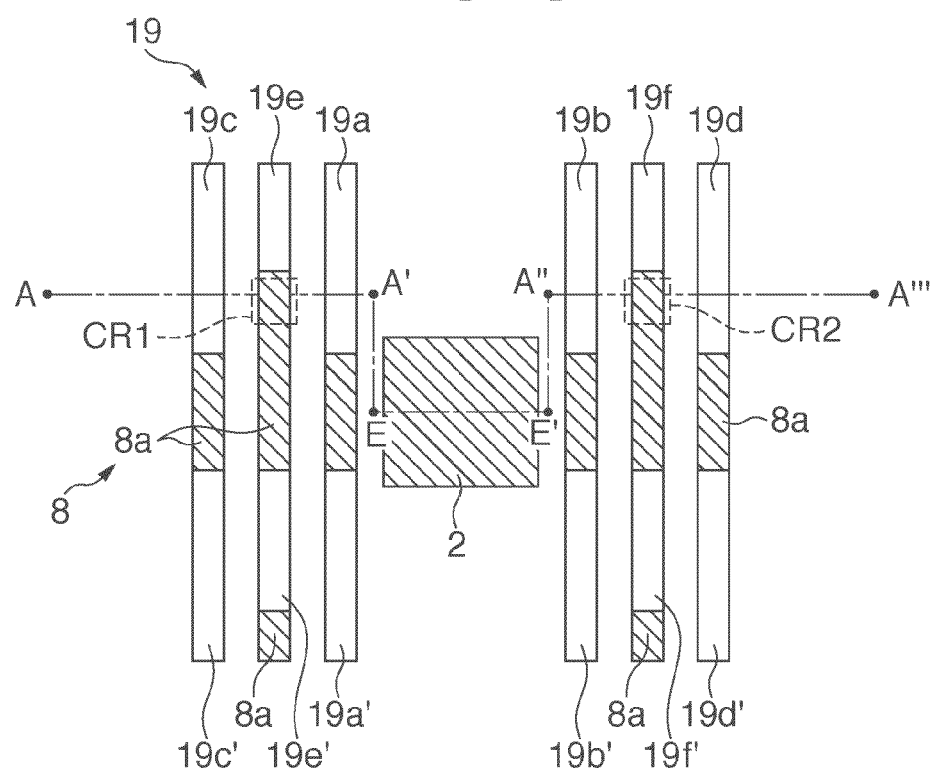
FIG. 5 is a plan view showing the method of manufacturing the semiconductor device SD according to the first embodiment.

In the step of FIG. 4, the portions 8a of the insulating film 8 on the first lines are etched using the etching mask 28 and polished insulating film 9 as a mask. A plurality of trenches 19a to 19f (see FIG. 5) are formed in the insulating film 8 to expose the first lines 7a to 7f so that each trench has a width equal to or smaller than that of a corresponding line (third step). The trenches 19a to 19f partially serve as the air gaps 10. As shown in FIGS. 4 and 5, the trenches 19a to 19f are formed on the first lines 7a to 7f in regions except for the regions CR1 and CR2 where the plugs 12a and 12b (see FIG. 6C) are to be arranged. As described above, the width of the trenches 19a to 19f is equal to or smaller than that of the first lines 7a to 7f. For example, when the insulating film 8 is made of $SiO_2$, dry etching is performed using an etching gas (e.g., $C_4F_8+CO+Ar+O_2$) which selectively etches $SiO_2$. In this case, the etching selectivity (etching rate ratio) of the insulating film 8 with respect to the insulating film 9 is high. That is, the insulating film 9 is resistant to etching of the insulating film 8. Thus, even when the portion 8a of the insulating film 8 that is positioned on the first line is thicker than the insulating film 9, the insulating film 8 can be selectively etched. After that, dry etching is executed under a condition that the insulating film 9 is selectively etched via the etching mask 28. For example, when the insulating film 9 is made of SiN, dry etching is done using an etching gas (e.g., $CH_2F_2+CO+O_2$) which selectively etches SiN. Accordingly, a portion 9g (see FIG. 3C) of the insulating film 9 that is positioned above the photoelectric converter 2 is removed.

In the step of FIG. 4, the portion 9g of the insulating film 9 and the portion 8a of the insulating film 8 may be simultaneously removed by performing dry etching via the etching mask 28 (see FIG. 3C). For example, dry etching is executed using a gas mixture of an etching gas (e.g., $C_4F_8+CO+Ar+O_2$) which selectively etches $SiO_2$ and an etching gas (e.g., $CH_2F_2+CO+O_2$) which selectively etches SiN. When the insulating film 8 is made of $SiO_2$ and the insulating film 9 is made of SiN, the etching selectivity (etching rate ratio) of the insulating film 8 with respect to the insulating film 9 becomes almost 1. Even in this case, removal of the portion 8a of the insulating film 8 and formation of the trench 19 serving as the air gap 10 can be achieved at once as long as etching anisotropy is good. Hence, the step of removing the polishing stopper layer (insulating film 9) left on the photoelectric converter 2 and the step of forming the trench 19 can be combined.

Figure 6A:
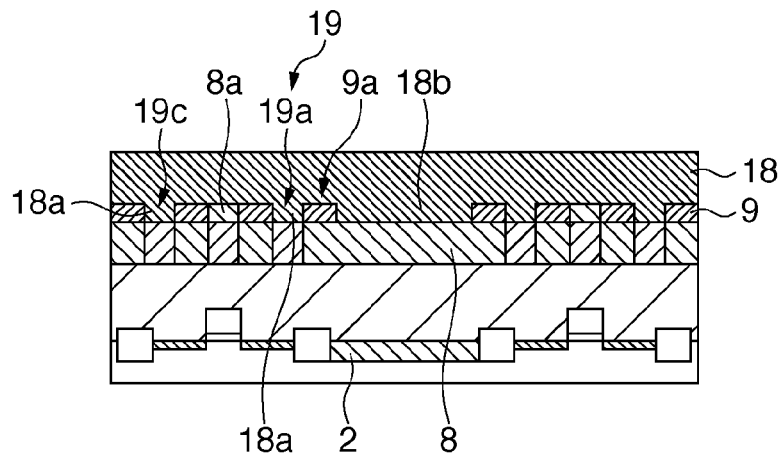
FIGS. 6A to 6C are sectional views showing the method of manufacturing the semiconductor device SD according to the first embodiment.

In the step of FIG. 6A, the trenches 19a to 19f are filled with organic insulators (first insulators) 18a using plasma CVD, and an opening 9c of the insulating film 9 is filled with an organic insulator 18b. An organic insulating film 18 is formed to cover the insulating film 9 (fourth step). The organic insulator 18a, organic insulator 18b, and organic insulating film 18 are formed continuously. The organic insulator 18a, organic insulator 18b, and organic insulating film 18 are made of, for example, SiOC.

Figure 6B:
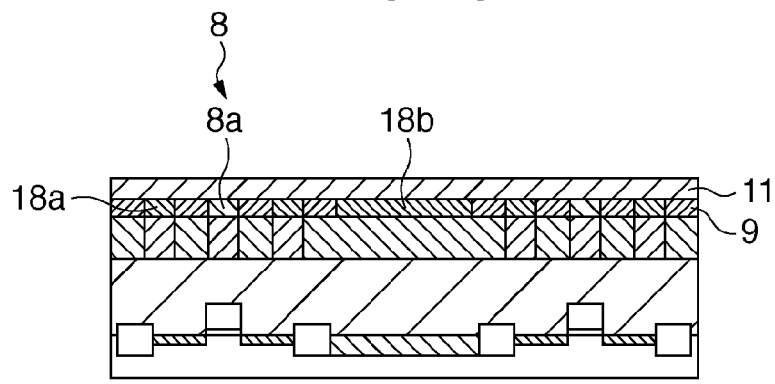

In the step of FIG. 6B, the organic insulating film 18, insulating film 9, and insulating film 8 are polished using CMP until the upper surface 9a of the insulating film 9 is exposed. As a consequence, the organic insulating film 18 is removed, the organic insulator 18a remain in the trenches 19a to 19f, and the organic insulator 18b remains in the opening 9c. At this time, each of the polishing rates of the insulating films 8 and 9 is equal to or lower than 1/5 of that of the organic insulating film 18. That is, the insulating film 9 is resistant to polishing of the organic insulating film 18, and thus functions as a polishing stopper layer. While leaving the organic insulators 18a and 18b, the organic insulating film 18 can be selectively polished, ending the planarization process. Subsequently, an insulating film 11 is formed using plasma CVD to cover the insulating film 8, insulating film 9, and organic insulator 18a. The insulating film 11 is made of, for example, $SiO_2$.

Figure 6C:
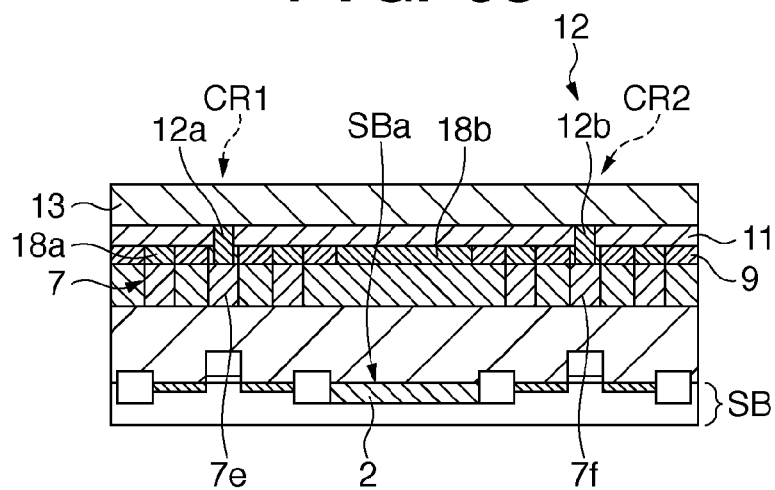

In the step of FIG. 6C, through holes (not shown) are formed in the insulating films 8 and 11 to expose, for example, the surfaces of the first electrically conductive lines 7e and 7f in the regions C1 and CR2. A metal layer is formed to fill the through holes and cover the insulating film 11. The metal layer is made of, for example, tungsten. The metal layer is polished until the surface of the insulating film 11 is exposed, forming plugs 12a and 12b. At this time, a portion of the insulating film 11 near the surface is also polished. Then, the respective films of a metal layered film (e.g., a layered film of TiN film/AlCu alloy film/TiN film) are sequentially deposited on the insulating film 11 by sputtering.

Figure 7A:
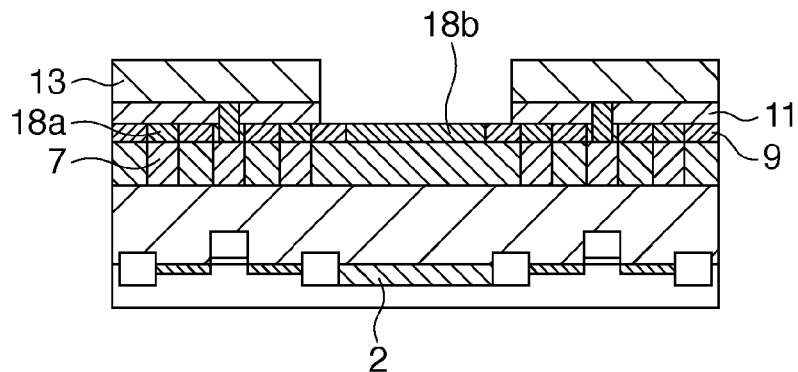
FIGS. 7A to 7C are sectional views showing the method of manufacturing the semiconductor device SD according to the first embodiment.
Figure 7B:
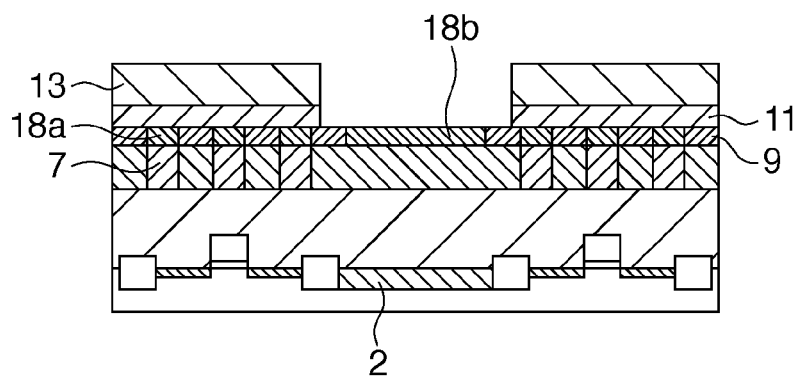
Figure 7C:
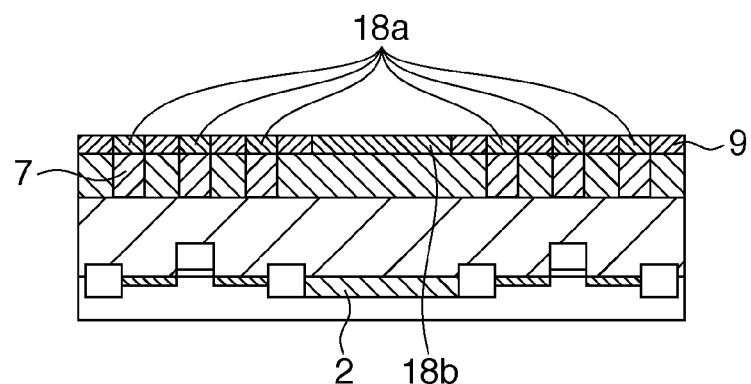
Figure 8:
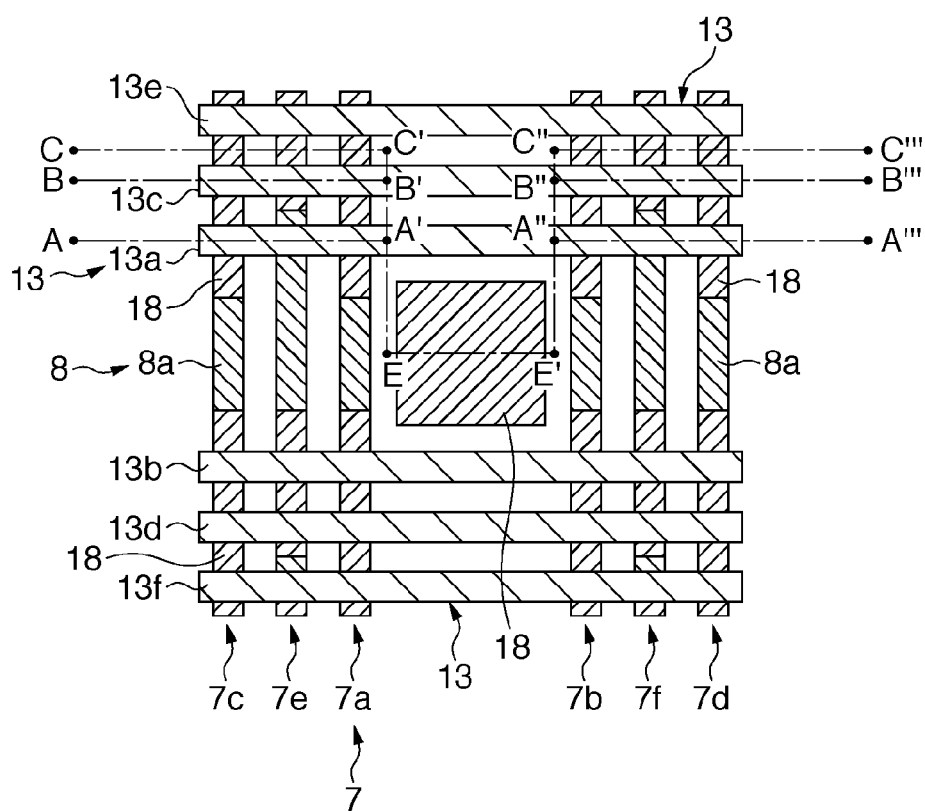
FIG. 8 is a plan view showing the method of manufacturing the semiconductor device SD according to the first embodiment.

FIGS. 7A to 7C show sections in the same step. In the step of FIGS. 7A to 7C, the pattern of the second wiring structure 13 is formed by patterning the insulating film 11 and metal layered film by photolithography and dry etching. More specifically, a plurality of second electrically conductive lines 13a to 13f are formed on the insulating film 8, organic insulators 18a, and insulating film 11 to intersect the first electrically conductive lines 7a to 7f (fifth step). The second electrically conductive lines 13a to 13f are formed to partially cover the upper surfaces of the organic insulators 18a. At this time, by an overetching process in the dry etching step, the insulating film 11 is also removed from a region where no second electrically conductive line is arranged, thereby exposing the organic insulators 18a, as shown in FIGS. 7C and 8. The region where no second electrically conductive line is arranged includes the opening region OR shown in FIGS. 1A and 1B. The second electrically conductive lines function as a mask in the dry etching step, as shown in FIGS. 7A, 7B, and 8. Hence, the insulating film 11 remains in regions where the second electrically conductive lines are arranged, and covers the organic insulators 18a.

Figure 9A:
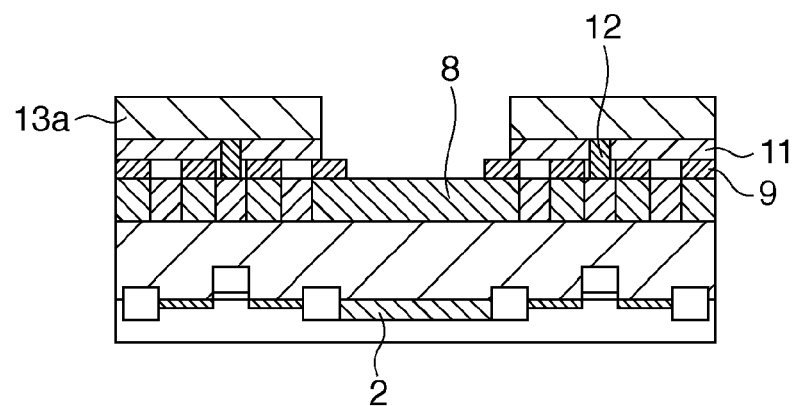
FIGS. 9A to 9C are sectional views showing the method of manufacturing the semiconductor device SD according to the first embodiment.
Figure 9B:
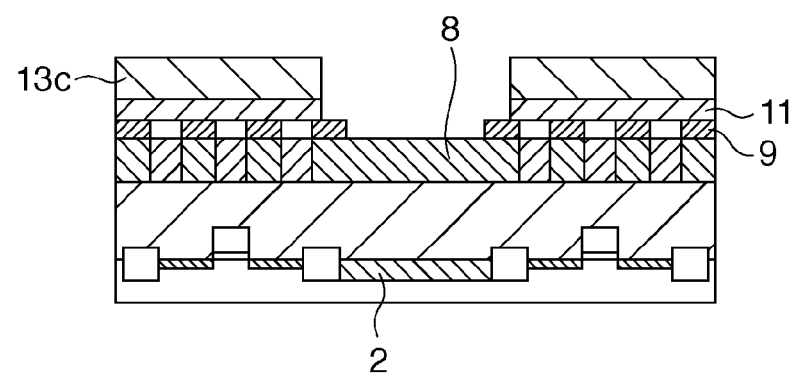
Figure 9C:
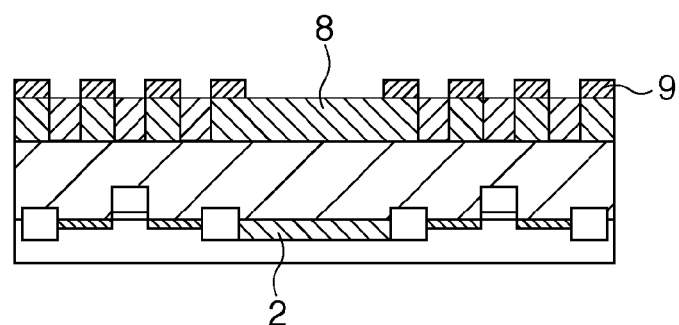
Figure 10:
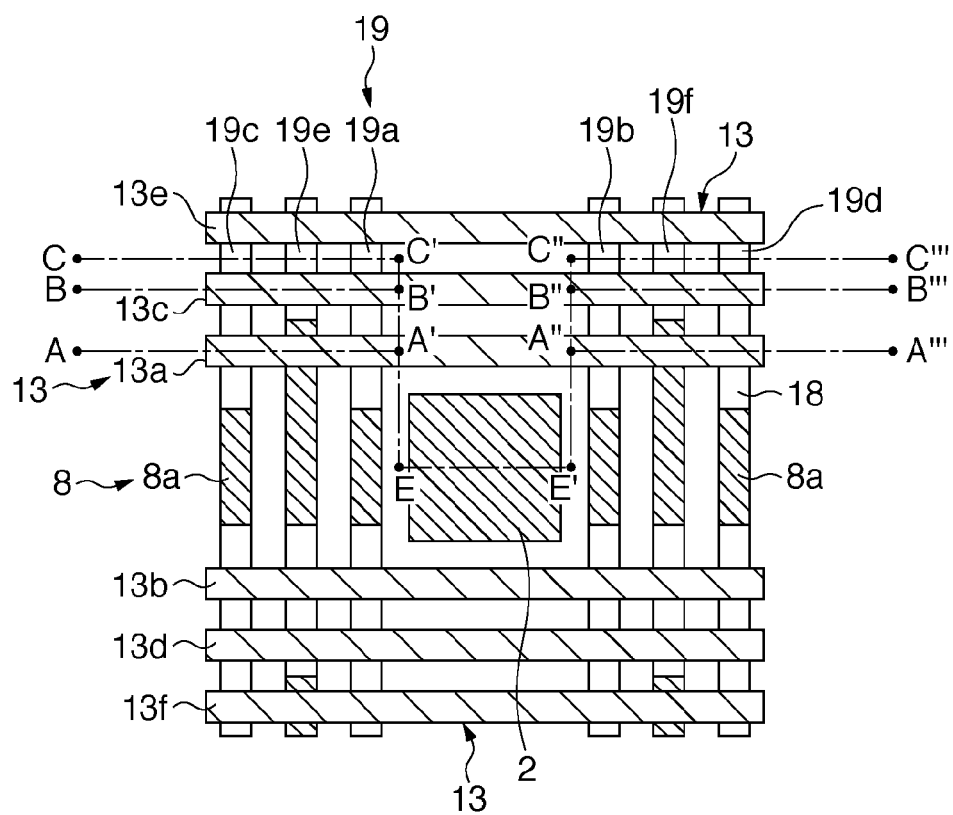
FIG. 10 is a plan view showing the method of manufacturing the semiconductor device SD according to the first embodiment.

FIGS. 9A to 9C show sections in the same step. In the step of FIGS. 9A to 9C, isotropic etching is done under a condition that the etching selectivity of the organic insulator 18a with respect to the insulating film 8, insulating film 9, and second electrically conductive line becomes high, thereby removing the organic insulators 18a from the trenches 19a to 19f (sixth step). The organic insulators 18a are removed from the trenches 19a to 19f by performing isotropic etching while exposing portions of the upper surfaces of the organic insulators 18a that do not overlap the second electrically conductive lines when viewed in a direction perpendicular to the surface SBa of the semiconductor substrate SB. The etching selectivity of the organic insulator 18a with respect to the insulating film 8, insulating film 9, and second electrically conductive line is 1/20 when, for example, $CF_4+O_2$ is used as an etching gas. For this reason, the organic insulators 18a can be selectively etched. Since dry etching is isotropic, even the organic insulators 18a below the second electrically conductive lines 13a and 13c are effectively removed by an etching gas (e.g., $CF_4+O_2$) flowing into the intervals, as shown in FIGS. 9A and 9B.

To remove the organic insulator 18a by dry etching, the step of exposing the organic insulator 18a can be executed using overetching in dry etching for patterning the second wiring structure 13. In this case, the step of exposing the organic insulator 18a and the step of patterning the second wiring structure 13 can be combined.

Figure 11A:
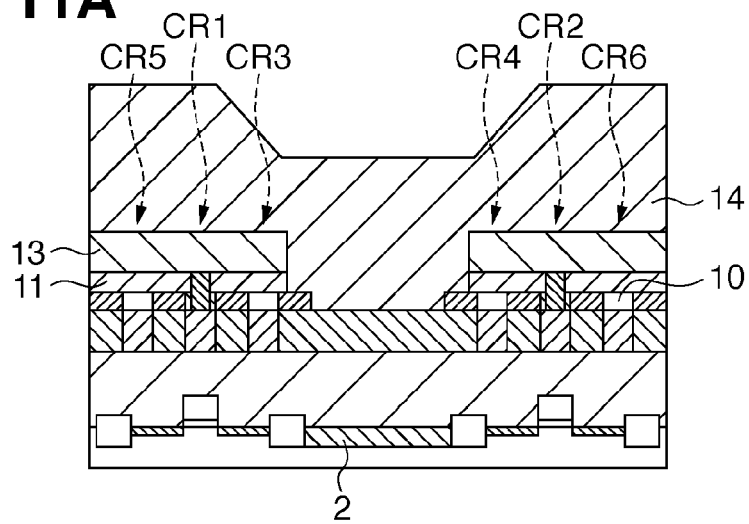
FIGS. 11A to 11C are sectional views showing the method of manufacturing the semiconductor device SD according to the first embodiment.
Figure 11B:
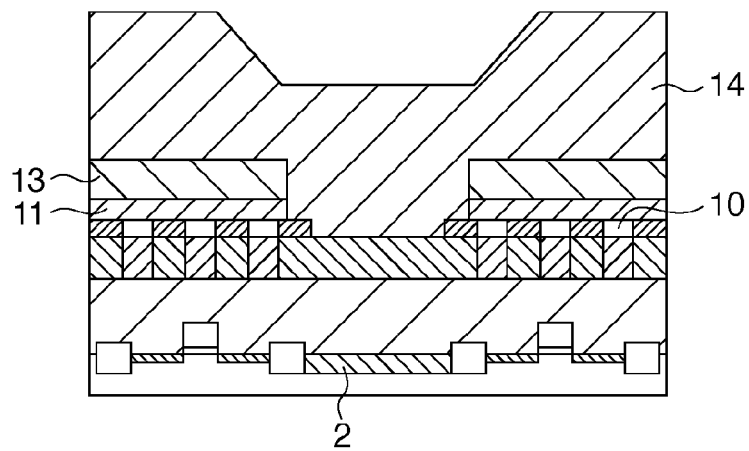
Figure 11C:
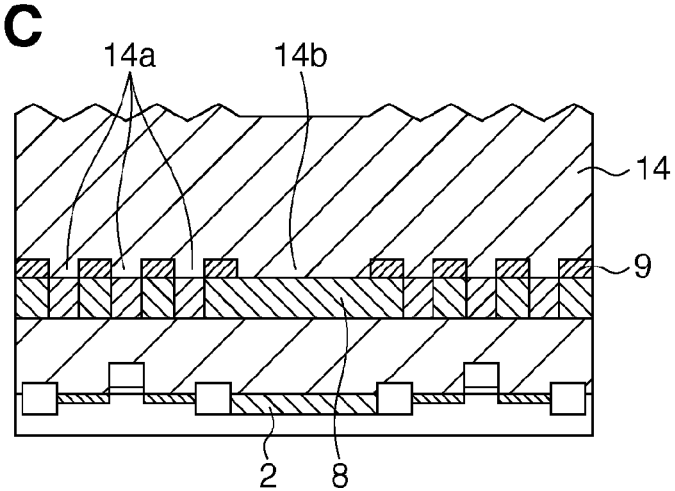

FIGS. 11A to 11C show sections in the same step. In the step of FIGS. 11A to 11C, insulators (second insulators) 14a are buried using high-density plasma CVD in portions of the trenches 19a to 19f that do not overlap the second electrically conductive lines 13a to 13f when viewed in a direction perpendicular to the surface of the semiconductor substrate (see FIG. 11C). An insulating film 14 is formed to cover the second electrically conductive lines 13a to 13f. The insulator 14a and insulating film 14 are formed continuously. The insulating film 14 is made of, for example, $SiO_2$. More specifically, the trenches 19a to 19f are filled with the insulators (second insulators) 14a to leave, as the air gaps 10, some of regions where the first and second electrically conductive lines intersect each other in the trenches 19a to 19f (in the trenches). At this time, the second insulators are buried in portions of the trenches 19a to 19f that do not overlap the second electrically conductive lines when viewed in a direction perpendicular to the surface SBa of the semiconductor substrate SB (seventh step). For example, the plugs 12a and 12b are arranged in the line-intersecting regions CR1 and CR2 among the line-intersecting regions CR1 to CR12 (see FIG. 1A), as shown in FIGS. 11A and 11B. The air gaps 10 are formed in the remaining line-intersecting regions CR3 to CR12. At this time, the space below each second electrically conductive line is a vacuum space because the CVD gas hardly flows into it. Alternatively, the air gap 10 kept filled with air is formed at a width equal to or smaller than that of the second electrically conductive line. In other words, the air gap 10 is formed so that the width of the air gap 10 in a direction along the first electrically conductive line becomes equal to or smaller than that of the second electrically conductive line. To the contrary, the width of the air gap 10 in a direction along the second electrically conductive line is equal to or smaller than that of the first electrically conductive line because the width of each trench is formed to be equal to or smaller than that of a corresponding first electrically conductive line in the step of FIG. 4. The upper surface of the insulating film 14 is planarized by polishing the insulating film 14 using CMP. Then, through holes (not shown) are formed in the insulating film 14 to expose, for example, the surfaces of the second electrically conductive lines. The through holes are filled with a metal (e.g., tungsten), forming plugs (not shown). Respective films of a metal layered film (e.g., a layered film of TiN film/AlCu alloy film/TiN film) are sequentially deposited on the insulating film 14 by sputtering. The metal layered film is formed into the pattern of the third wiring structure (not shown) by photolithography and dry etching.

As shown in FIG. 2B, the column 27 included in the insulating films 8 and 9 supports the gap between the second wiring structure 13 and the insulating film 6 via the insulating film 11. This structure can maintain the mechanical strength of the whole multilayer wiring structure ML even when the second wiring structure 13 becomes long in the lateral direction in FIG. 2B. The multilayer wiring structure ML is hardly broken even when stress is applied by CMP or the like in subsequent steps. The air gaps 10 defined in regions (e.g., the line-intersecting regions CR3 to CR12) where the first and second electrically conductive lines intersect each other reduce the line-to-line capacitance between the first and second electrically conductive lines. In this fashion, the manufacturing method according to the embodiment can provide the semiconductor device SD capable of suppressing a decrease in mechanical strength of the multilayer wiring structure ML while reducing the line-to-line capacitance in the multilayer wiring structure ML.

Figure 12:
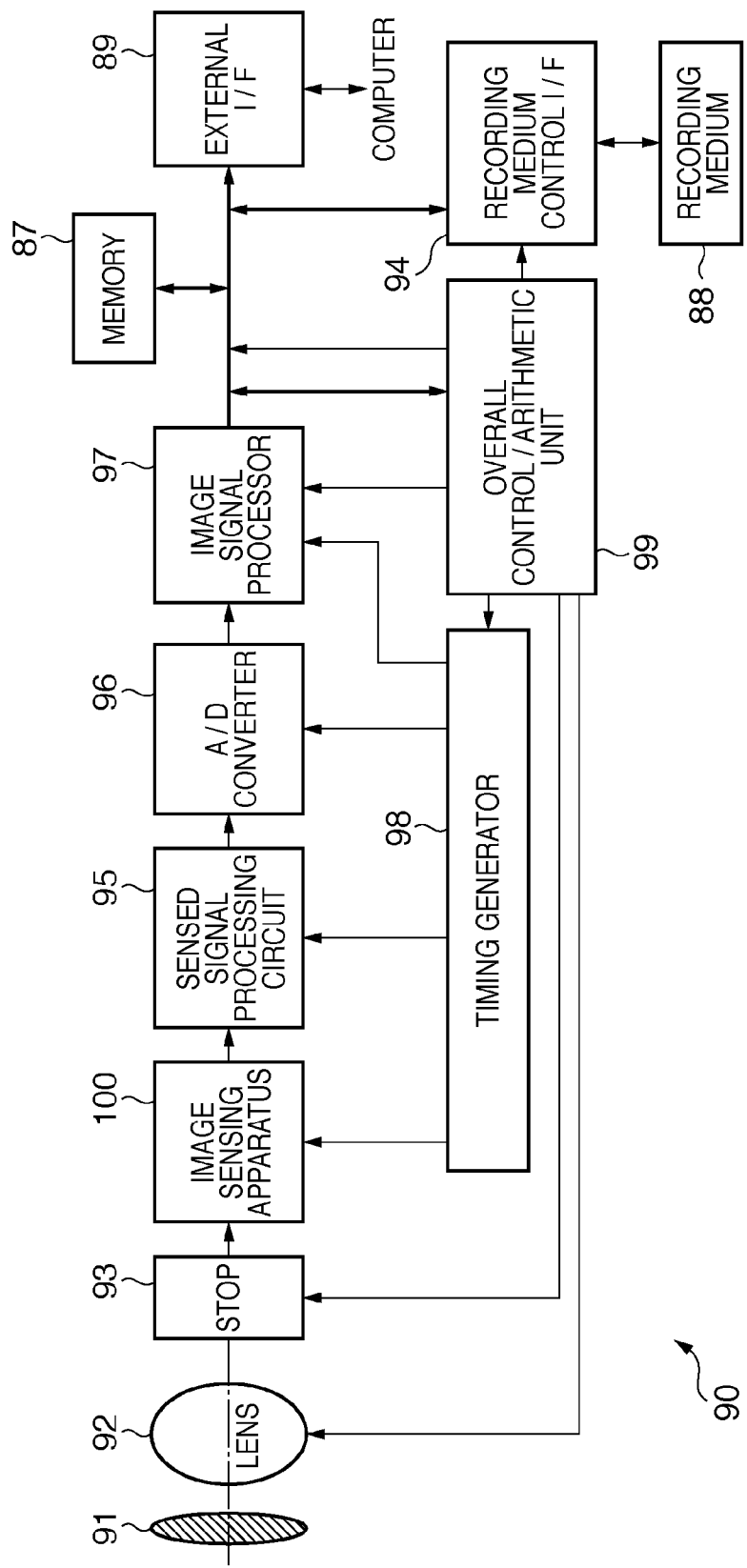
FIG. 12 is a block diagram of the configuration of an imaging system to which a photoelectric conversion device according to the first embodiment is applied.

FIG. 12 exemplifies an imaging system to which the photoelectric conversion device of the present invention is applied. As shown in FIG. 12, an imaging system 90 mainly includes an optical system, image sensing apparatus 86, and signal processing unit. The optical system mainly includes a shutter 91, lens 92, and stop 93. The image sensing apparatus 86 includes the photoelectric conversion device 100. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88. The shutter 91 is arranged in front of the lens 92 on the optical path to control the exposure. The lens 92 refracts incident light to form an object image on the image sensing surface of the photoelectric conversion device 100 of the image sensing apparatus 86. The stop 93 is interposed between the lens 92 and the photoelectric conversion device 100 on the optical path. The stop 93 adjusts the quantity of light guided to the photoelectric conversion device 100 after passing through the lens 92. The photoelectric conversion device 100 of the image sensing apparatus 86 converts an object image formed on the image sensing surface of the photoelectric conversion device 100 into an image signal. The image sensing apparatus 86 reads out the image signal from the photoelectric conversion device 100, and outputs it. The sensed signal processing circuit 95 is connected to the image sensing apparatus 86, and processes an image signal output from the image sensing apparatus 86. The A/D converter 96 is connected to the sensed signal processing circuit 95. The A/D converter 96 converts a processed image signal (analog signal) output from the sensed signal processing circuit 95 into an image signal (digital signal). The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like. The memory 87 is connected to the image signal processor 97, and stores image data output from the image signal processor 97. The external I/F 89 is connected to the image signal processor 97. Image data output from the image signal processor 97 is transferred to an external device (e.g., a personal computer) via the external I/F 89. The timing generator 98 is connected to the image sensing apparatus 86, sensed signal processing circuit 95, A/D converter 96, and image signal processor 97. The timing generator 98 supplies timing signals to the image sensing apparatus 86, sensed signal processing circuit 95, A/D converter 96, and image signal processor 97. The image sensing apparatus 86, sensed signal processing circuit 95, A/D converter 96, and image signal processor 97 operate in synchronism with the timing signals. The overall control/arithmetic unit 99 is connected to the timing generator 98, image signal processor 97, and recording medium control I/F 94, and comprehensively controls them. The recording medium 88 is detachably connected to the recording medium control I/F 94. Image data output from the image signal processor 97 is recorded on the recording medium 88 via the recording medium control I/F 94. With this arrangement, a high-quality image (image data) can be obtained as long as the photoelectric conversion device 100 can attain a high-quality image signal.

A semiconductor device SD200 according to the second embodiment of the present invention will be described with reference to FIGS. 13 to 21C. A difference from the first embodiment will be mainly explained.

Figure 13:
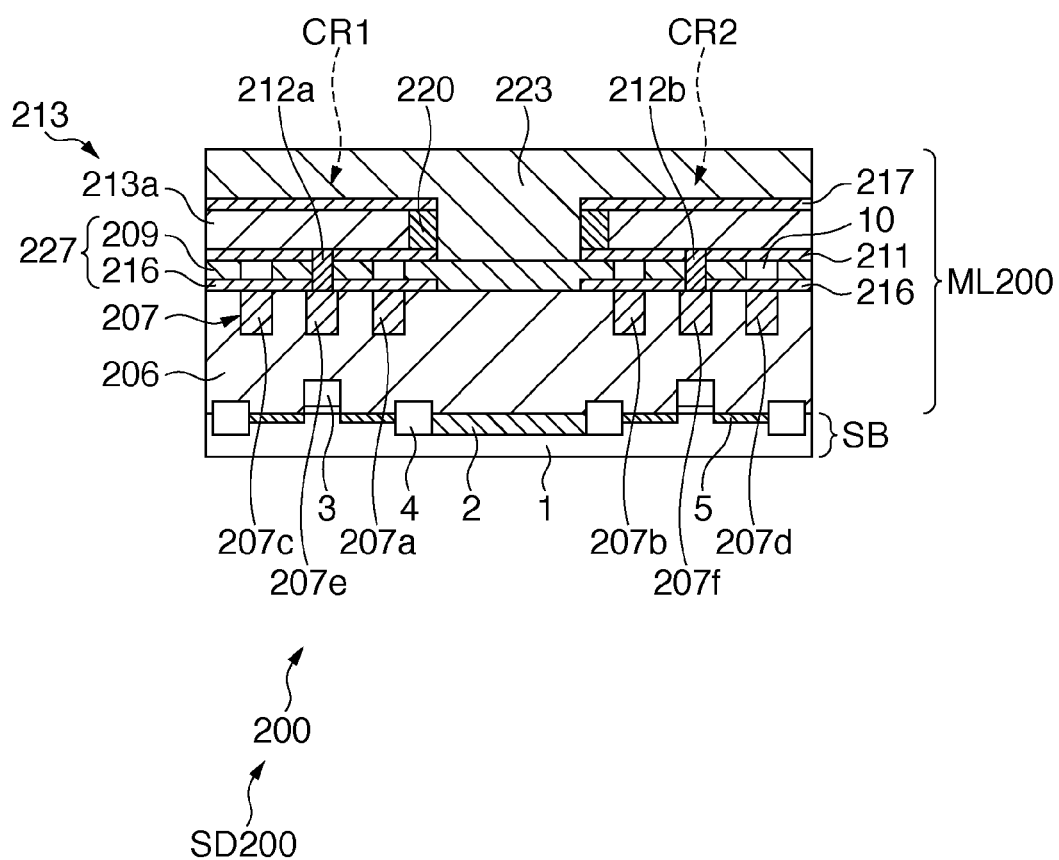
FIG. 13 is a sectional view showing the structure of a semiconductor device SD200 according to the second embodiment.

As shown in FIG. 13, the semiconductor device SD200 includes a photoelectric conversion device 200. FIG. 13 is a sectional view showing a section corresponding to that in FIG. 1B in the semiconductor device SD200. The photoelectric conversion device 200 of the semiconductor device SD200 includes a multilayer wiring structure ML200. The multilayer wiring structure ML200 has a dual damascene structure. The multilayer wiring structure ML200 includes the following building elements, unlike the first embodiment. A first wiring structure 207 is arranged in an insulating film 206. The first wiring structure 207 is made of, for example, a metal or intermetallic compound mainly containing copper. A plurality of first electrically conductive lines 207a to 207f in the first wiring structure 207 are respectively buried in trenches formed in the insulating film 206 by the single damascene method. A diffusion suppressing film (diffusion barrier film) 216 covers the first wiring structure 207. The diffusion suppressing film 216 suppresses diffusion of the material (e.g., copper) of the first wiring structure 207 into an insulating film 209. A second wiring structure 213 is arranged in an insulating film 220. The second wiring structure 213 is made of, for example, a metal or intermetallic compound mainly containing copper. A plurality of second electrically conductive lines 213a to 213f in the second wiring structure 213 are formed by burying the above-mentioned material in trenches formed in the insulating film 220 by the dual damascene method. An insulating film 211 functions as an etching stopper layer when performing etching to form trenches for burying the second electrically conductive lines in the dual damascene method. A diffusion suppressing film (diffusion barrier film) 217 covers the second wiring structure 213. The diffusion suppressing film 217 suppresses diffusion of the material (e.g., copper) of the second wiring structure 213 into an insulating film 223. The diffusion suppressing film 216, insulating film 211, and diffusion suppressing film 217 have openings at positions above a photoelectric converter 2.

Plugs 212a and 212b are arranged in line-intersecting regions CR1 and CR2 among line-intersecting regions CR1 to CR12 (see FIGS. 1A, 1B, and 2A). The plugs 212a and 212b are made of, for example, a metal or intermetallic compound mainly containing copper. The plugs 212a and 212b are formed by burying this material in holes formed in the insulating film 211, insulating film 209, and diffusion suppressing film 216 by the dual damascene method. Similar to the first embodiment, air gaps 10 are defined in the remaining line-intersecting regions CR3 and CR12 among the line-intersecting regions CR1 to CR12. On the four sides of the air gap 10, columns 227 support the gap between the insulating films 206 and 211. The diffusion suppressing film 216 and insulating film 209 include the column 227.

Figure 14A:
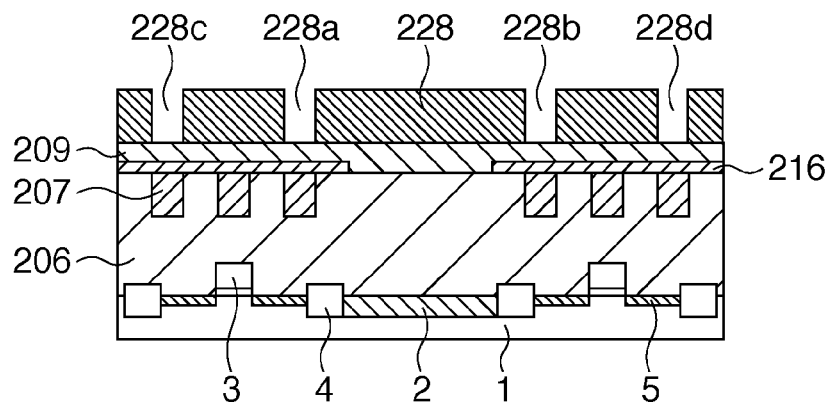
FIGS. 14A to 14C are sectional views showing a method of manufacturing the semiconductor device SD200 according to the second embodiment.
Figure 14B:
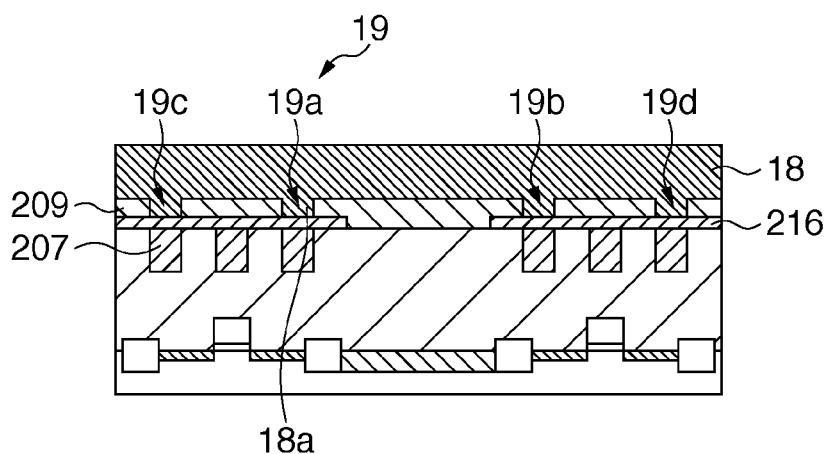
Figure 14C:
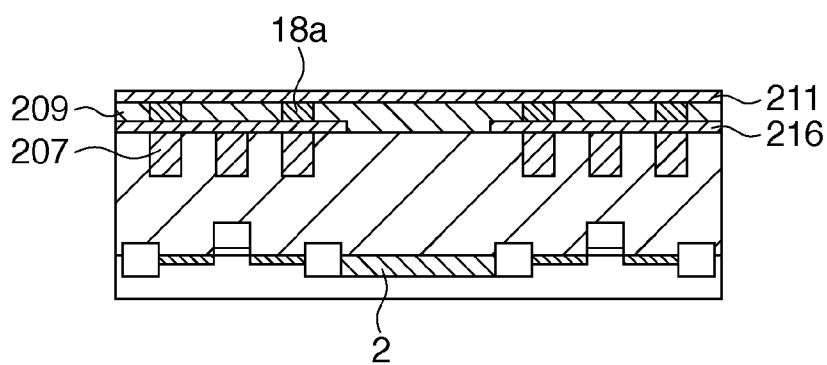
Figure 15:
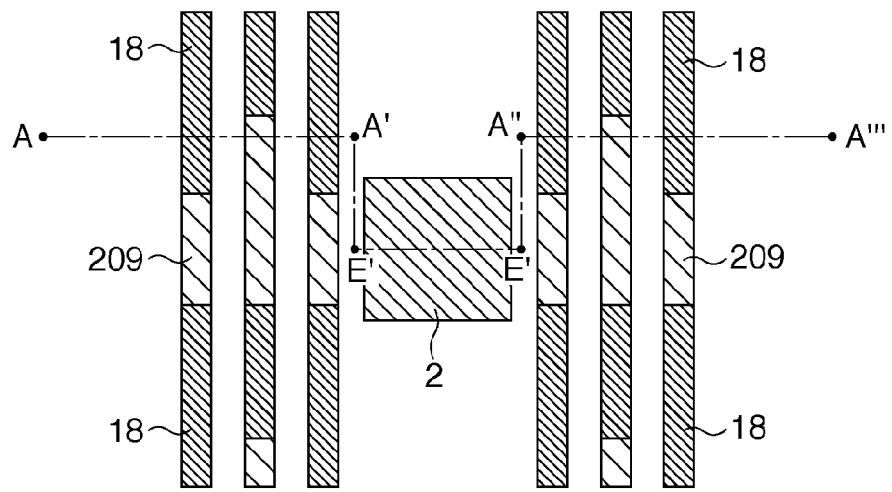
FIG. 15 is a plan view showing the method of manufacturing the semiconductor device SD200 according to the second embodiment.
Figure 16:
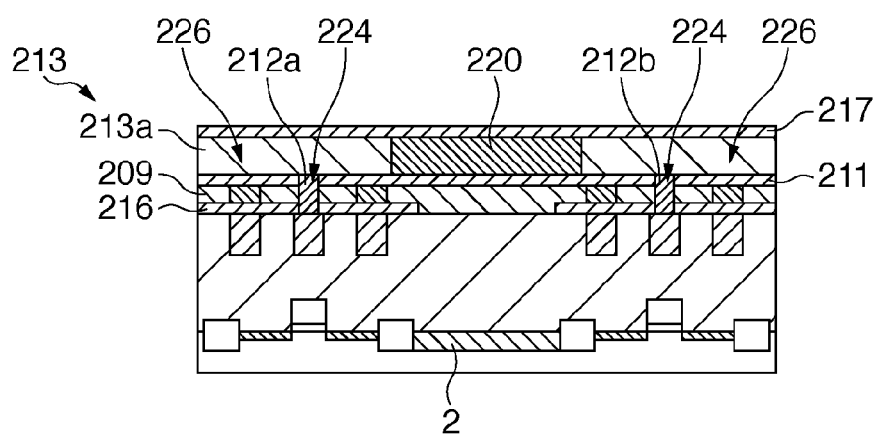
FIG. 16 is a sectional view showing the method of manufacturing the semiconductor device SD200 according to the second embodiment.
Figure 17:
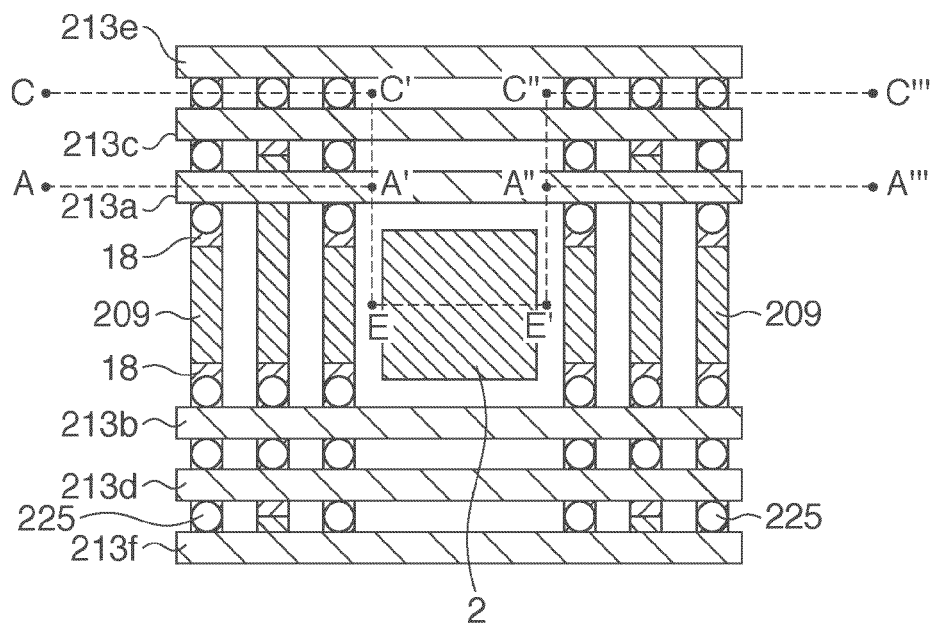
FIG. 17 is a plan view showing the method of manufacturing the semiconductor device SD200 according to the second embodiment.

A method of manufacturing the semiconductor device SD200 is different in the following points from the first embodiment, as shown in FIGS. 14A to 21C. Sections shown in FIGS. 14A to 14C and 16 correspond to that in FIG. 1B. FIG. 15 is a plan view in the step of FIG. 14C. Sections shown in FIGS. 18 and 19 correspond to those in FIGS. 2C and 1B. FIG. 17 is a plan view in the steps of FIGS. 18 and 19. Sections shown in FIGS. 20B and 20C correspond to those in FIGS. 2C and 1B. FIG. 20A is a plan view in the steps of FIGS. 20B and 20C. Sections shown in FIGS. 21B and 21C correspond to those in FIGS. 2C and 1B. FIG. 21A is a plan view in the steps of FIGS. 21B and 21C.

In the step of FIG. 14A, the upper surface of the insulating film 206 is planarized and a first wiring structure 207 is formed by the damascene method. More specifically, trenches for burying the material (e.g., a metal or intermetallic compound mainly containing copper) of the first wiring structure 207 are formed in the insulating film 206. The material is buried in the trenches, forming the first wiring structure 207. A diffusion suppressing film 216 is formed using plasma CVD to cover the first wiring structure 207. The diffusion suppressing film 216 is made of, e.g., SiN. Then, a portion of the diffusion suppressing film 216 that is positioned above the photoelectric converter 2 is removed by dry etching after photolithography. An insulating film 209 is formed using plasma CVD to cover the insulating film 206 and diffusion suppressing film 216. The insulating film 209 is made of, for example, SiO$_2$. A step generated on the upper surface of the insulating film 209 is polished and planarized by CMP. An etching mask 228 is formed on the insulating film 209 by photolithography. The etching mask 228 has openings 228a to 228d in regions where trenches 19 (see FIG. 5) are to be formed.

In the step of FIG. 14B, portions of the insulating film 209 that are positioned above the first electrically conductive lines are etched via the etching mask 228 (see FIG. 14A). As a result, a plurality of trenches 19a to 19f (see FIG. 5) are formed in the insulating film 209 so that the width of each trench becomes equal to or smaller than that of a corresponding first electrically conductive line, similar to the first embodiment. Thereafter, the same process as that in the step of FIG. 6A is done.

In the step of FIG. 14C, the same planarization process as that in the step of FIG. 6B is performed, exposing organic insulators 18a, as shown in FIG. 15. An insulating film 211 is formed using plasma CVD to cover the insulating film 209 and organic insulators 18a. The insulating film 211 is made of, for example, SiN. The insulating film 211 functions as an etching stopper layer when performing etching to form holes for burying the second electrically conductive lines in the dual damascene method.

In the step of FIG. 16, an insulating film (second insulating film) 220 is formed on the insulating film 211 using plasma CVD. First holes 224 for burying the plugs 212a and 212b in the dual damascene method are formed in the insulating films 220, 211, and 209, and diffusion suppressing film 216 by photolithography. Second trenches 226 for burying the second electrically conductive lines in the dual damascene method are formed in the insulating film 220 by photolithography. A Ta film and electrically conductive shielding film are formed by sputtering. The first holes 224 and second trenches 226 are filled with conductors by plating. The conductor is made of, for example, a metal or intermetallic compound mainly containing copper. The conductors are polished and planarized by CMP, forming plugs 212a and 212b and a second wiring structure 213 complying with the second trenches 226. A diffusion suppressing film 217 is formed using plasma CVD to cover the second wiring structure 213 and insulating film 220. The diffusion suppressing film 217 is made of, for example, SiN.

Figure 18:
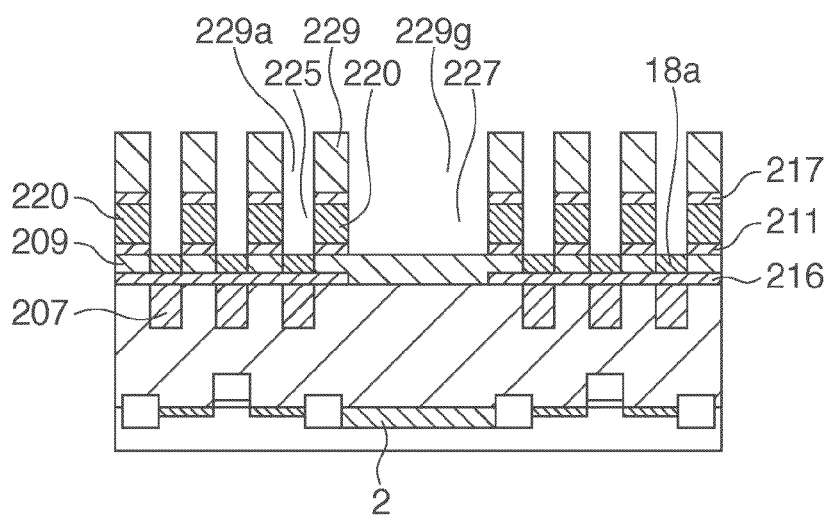
FIG. 18 is a sectional view showing the method of manufacturing the semiconductor device SD200 according to the second embodiment.
Figure 19:
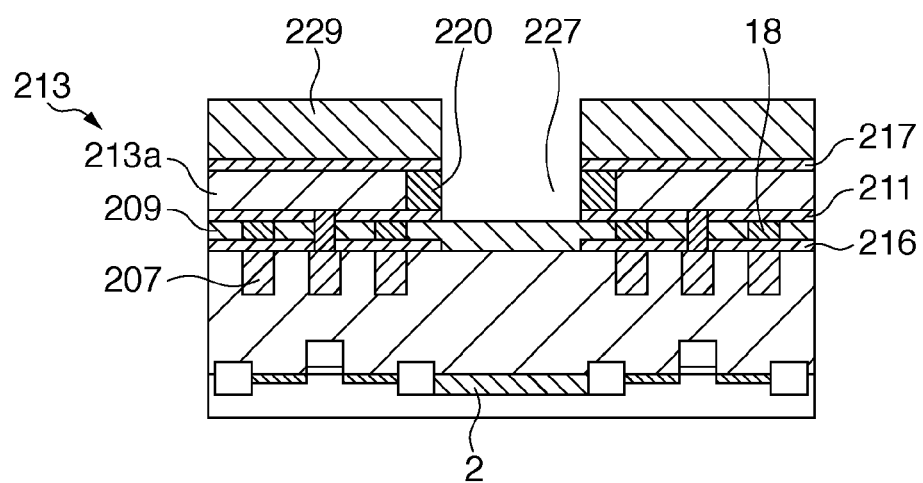
FIG. 19 is a sectional view showing the method of manufacturing the semiconductor device SD200 according to the second embodiment.

FIGS. 18 and 19 show sections in the same step. In the step of FIGS. 18 and 19, an etching mask 229 is formed on the diffusion suppressing film 217 by photolithography. The etching mask 229 has an opening 229g in a region above the photoelectric converter 2, and has openings 229a in regions where second holes 225 (to be described later) are to be formed to expose the organic insulators 18a. The diffusion suppressing film 217, insulating film 220, and insulating film 211 are etched using the etching mask 229 and second electrically conductive lines as a mask. Accordingly, the second holes 225 are formed in the diffusion suppressing film 217, insulating film 220, and insulating film 211 to expose portions of the upper surfaces of the organic insulators 18a that do not overlap the second electrically conductive lines when viewed in a direction perpendicular to a surface SBa of the semiconductor substrate (see FIG. 17). At this time, portions of the diffusion suppressing film 217, insulating film 220, and insulating film 211 that are positioned above the photoelectric converter 2 are also removed, forming a third trench 230.

Figure 20A:
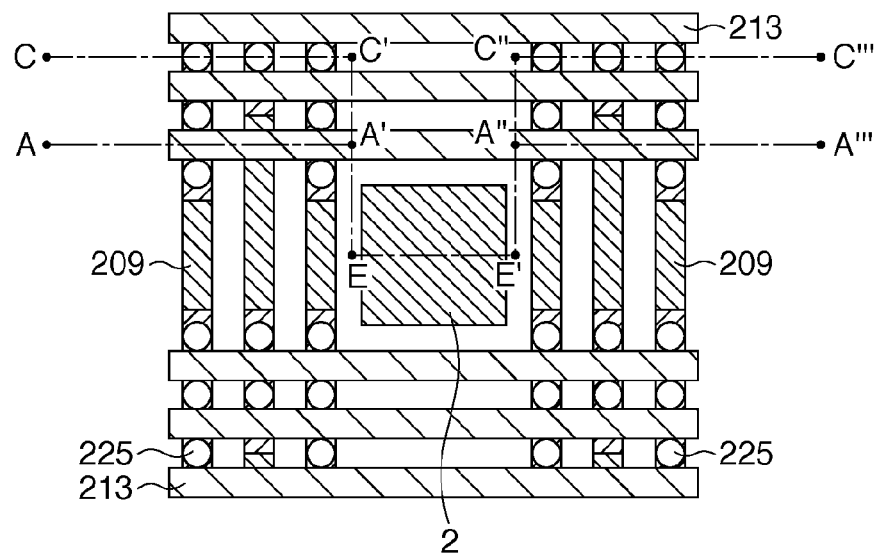
FIGS. 20A to 20C are plan views and sectional views, respectively, showing the method of manufacturing the semiconductor device SD200 according to the second embodiment.
Figure 20B:
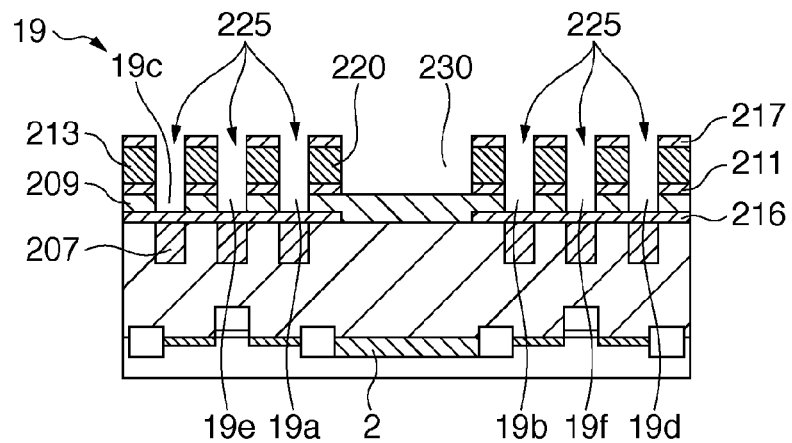
Figure 20C:
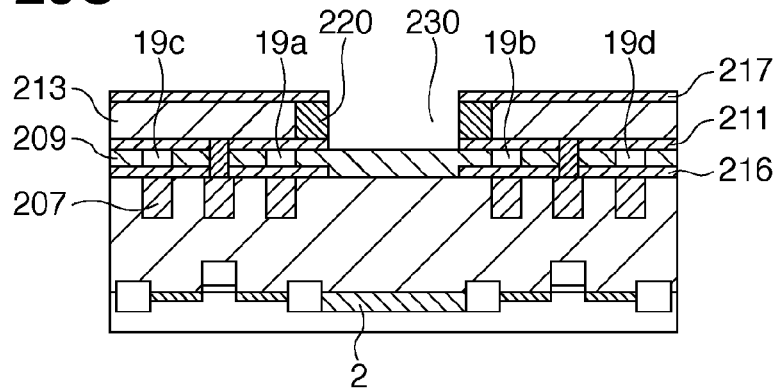

FIGS. 20A to 20C are a plan view and sectional views in the same step, respectively. In the step of FIGS. 20A to 20C, isotropic etching is done via the second holes 225 under a condition that the etching selectivity of the organic insulator 18a with respect to the diffusion suppressing film 217 and insulating films 220, 211, and 209 becomes high, thereby removing the organic insulators 18a from the trenches 19a to 19f (see FIG. 5). At this time, the diffusion suppressing film 216 and insulating film 209 are highly resistant to isotropic dry etching of the organic insulator 18a. It is therefore easy to selectively etch the organic insulators 18a (see FIG. 20B). Since dry etching is isotropic, the organic insulators 18a below the second wiring structure 213 are removed by an etching gas flowing into the intervals (see FIG. 20C).

Figure 21A:
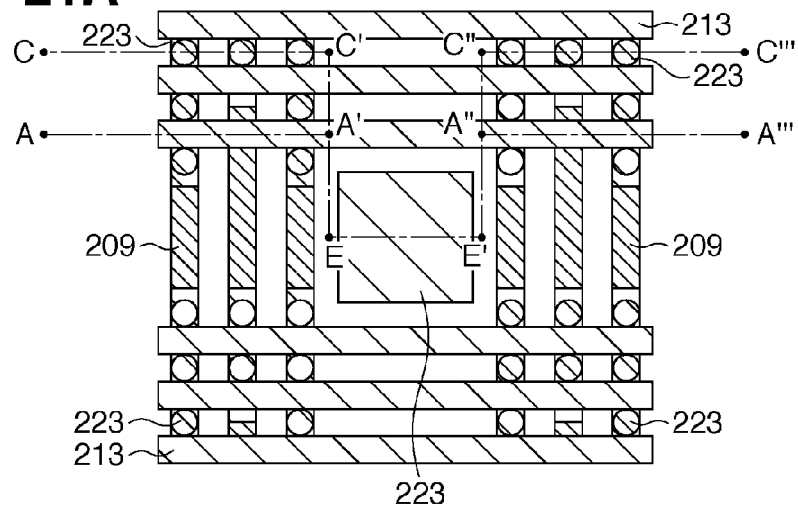
FIGS. 21A to 21C are plan views and sectional views, respectively, showing the method of manufacturing the semiconductor device SD200 according to the second embodiment.
Figure 21B:
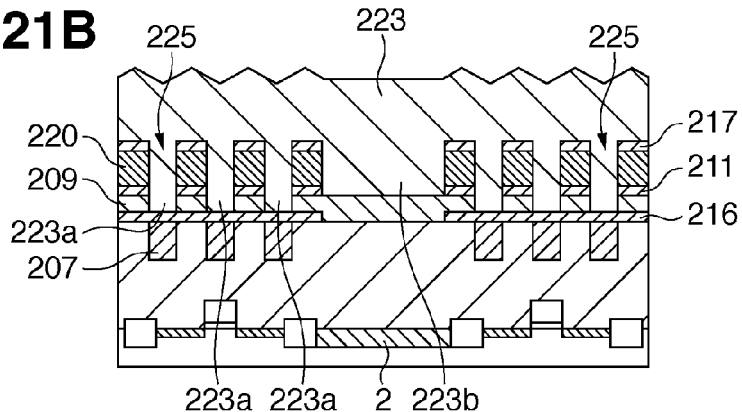
Figure 21C:
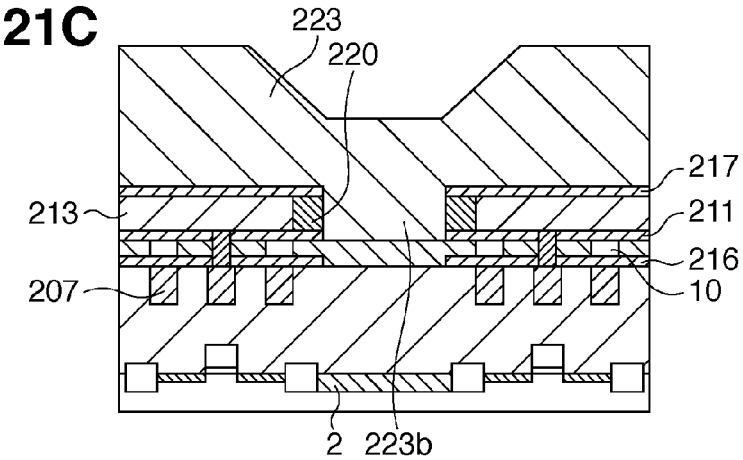

In the steps of FIGS. 21A to 21C, the second holes 225 are filled with insulators (second insulators) 223a using high-density plasma CVD. Also, the third trench 230 is filled with an insulator 223b. An insulating film 223 is formed to cover the diffusion suppressing film 217. More specifically, the trenches 19a to 19f are filled with the insulators 223a via the second holes 225 to leave, as the air gaps 10, some of regions where the first and second electrically conductive lines intersect each other in the trenches 19a to 19f. At this time, the space below each second electrically conductive line is a vacuum space because the CVD gas hardly flows into it. Alternatively, the air gap 10 kept filled with air is formed at a width equal to or smaller than that of the second electrically conductive line. That is, the air gap 10 is formed so that the width of the air gap 10 in a direction along the first electrically conductive line becomes equal to or smaller than that of the second electrically conductive line. In contrast, the width of the air gap 10 in a direction along the second electrically conductive line is equal to or smaller than that of the first electrically conductive line because the width of each trench is formed to be equal to or smaller than that of a corresponding first electrically conductive line in the step of FIG. 14B.

In the semiconductor device manufacturing method, the process of removing portions of the etching stopper layer and diffusion suppressing film that are positioned above the photoelectric converter can be executed using the step of forming air gaps. The number of steps can therefore be decreased in comparison with a case in which the process of removing portions of the etching stopper layer and diffusion suppressing film and the process of forming air gaps are performed in separate steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-137721, filed Jun. 8, 2009, which is hereby incorporated by reference herein in its entirety.

What is claimed is:

1. A method of manufacturing a semiconductor device having a semiconductor substrate, the method comprising:
    a first step of forming a plurality of first electrically conductive lines above the semiconductor substrate;
    a second step of forming an insulating film to cover the plurality of first electrically conductive lines;
    a third step of forming a plurality of trenches in the insulating film at a width not larger than a width of a first electrically conductive line of the plurality of first electrically conductive lines, the plurality of trenches exposing a part of upper surfaces of the plurality of first electrically conductive lines;
    a fourth step of filling the plurality of trenches with first insulators;
    a fifth step of forming second electrically conductive lines on the insulating film and the first insulators so as to intersect the plurality of first electrically conductive lines;
    a sixth step of removing the first insulators from the respective trenches after said fifth step; and
    a seventh step of filling, with second insulators, portions of the plurality of trenches that do not overlap the second electrically conductive lines when viewed in a direction perpendicular to a surface of the semiconductor substrate, so as to leave, as gaps, at least some of a plurality of regions where the plurality of first electrically conductive lines and the second electrically conductive lines intersect each other in the plurality of trenches,
    wherein a width of the gap in a direction along a second electrically conductive line of the second electrically conductive lines is not larger than a width of a first electrically conductive line of the plurality of first electrically conductive lines.

2. The method according to claim 1, wherein the first insulators are removed from the plurality of trenches by performing isotropic etching under a condition that etching selectivity of the first insulator with respect to the insulating film and a second electrically conductive line of the second electrically conductive lines becomes high, while exposing portions of upper surfaces of the first insulators that do not overlap the second electrically conductive lines when viewed in the direction perpendicular to the surface of the semiconductor substrate.

3. The method according to claim 1, wherein said fifth step comprises steps of:
    forming a second insulating film on the insulating film and the first insulators;
    forming second trenches in the second insulating film to intersect the plurality of first electrically conductive lines; and
    filling the second trenches with conductors to form the second electrically conductive lines corresponding to the second trenches,
    said sixth step comprises steps of:
        forming a plurality of holes in the second insulating film to expose portions of the upper surfaces of the first insulators that do not overlap the second electrically conductive lines when viewed in the direction perpendicular to the surface of the semiconductor substrate; and
        removing the first insulators from the plurality of trenches by performing isotropic etching via the plurality of holes under a condition that etching selectivity of the first insulator with respect to the insulating film and a second electrically conductive line of the second electrically conductive lines becomes high, and
    in said seventh step, the plurality of trenches are filled with the second insulators via the plurality of holes.

4. The method according to claim 1, wherein the semiconductor device includes a photoelectric conversion device, and the semiconductor substrate includes a photoelectric converter.

* * * * *